(12) United States Patent
De Gouy et al.

(10) Patent No.: US 7,218,699 B2
(45) Date of Patent: May 15, 2007

(54) FREQUENCY DIVIDER

(75) Inventors: Jean-Luc De Gouy, Briis Sous Forges (FR); Pascal Gabet, Cholet (FR)

(73) Assignee: Thales, Neuilly s/Seine (FR)

( * ) Notice: Subject to any disclaimer, the term of this patent is extended or adjusted under 35 U.S.C. 154(b) by 0 days.

(21) Appl. No.: 11/038,487

(22) Filed: Jan. 21, 2005

(65) Prior Publication Data

US 2005/0179475 A1    Aug. 18, 2005

(30) Foreign Application Priority Data

Jan. 20, 2004    (FR) .................................. 04 00496

(51) Int. Cl.
*H03K 21/00* (2006.01)
(52) U.S. Cl. ........................................ 377/47; 327/117
(58) Field of Classification Search .................... None
See application file for complete search history.

(56) References Cited

U.S. PATENT DOCUMENTS 5,754,615 A  *  5/1998  Colavin ........................ 377/47

6,310,653 B1 * 10/2001 Malcolm et al. ............ 348/537

FOREIGN PATENT DOCUMENTS

| JP | 01157616 | 6/1989 |
|---|---|---|
| JP | 9289445 A | 2/1998 |

* cited by examiner

*Primary Examiner*—Timothy P. Callahan
*Assistant Examiner*—Cassandra Cox
(74) *Attorney, Agent, or Firm*—Lowe Hauptman & Berner, LLP

(57) ABSTRACT

A divider to divide a frequency $F_e$ comprises at least the following elements: three flip-flop circuits, each of the flip-flop circuits receiving the frequency to be divided, every feedback loop between an output of a flip-flop circuit and its input or the input of the other flip-flop circuits comprising a single multiplexer, wherein one of the flip-flop circuits commands the loading of all the flip-flop circuits during one period of the frequency A multiplexer has two inputs, one selection bit and one output and is integrated into a flip-flop circuit.

6 Claims, 2 Drawing Sheets

FREQUENCY DIVIDER

RELATED APPLICATIONS

The present application is based on, and claims priority from, French Application Number 0400496, filed Jan. 20, 2004, the disclosure of which is hereby incorporated by reference herein in its entirety.

BACKGROUND OF THE INVENTION

The invention pertains to a frequency division device with at least three division ratios.

It can be applied, for example, in the field of frequency synthesis as a front-end divider for a fractional ratio division chain.

Prior art front-end dividers are generally dividers with two consecutive division ratios.

SUMMARY OF THE INVENTION

The invention relates to a device for dividing a frequency $F_e$. The device comprises at least the following elements:

three flip-flop circuits ($U_1$, $U_2$, $U_3$), each of the flip-flop circuits receiving the frequency $F_e$ to be divided, every feedback loop between an output of a flip-flop circuit and its input or the input of the other flip-flop circuits comprising a single multiplexer ($M_1$, $M_2$, $M_3$), wherein one of the flip-flop circuits commands the loading of all the flip-flop circuits ($U_1$, $U_2$, $U_3$) during a period of $F_e$.

A multiplexer comprises, for example two inputs, one selection bit and one output and is integrated into a flip-flop circuit.

The device may have two latch circuits ($U_4$, $U_5$) and two multiplexers ($M_4$, $M_5$), respectively receiving the inputs INC1 and INC2 of the divider. The multiplexer may be integrated with a flip-flop circuit.

The device can be applied to a divider with three division ratios 2/3/4.

The invention has especially the following advantages: its working frequency is the maximum because the feedback loop paths between the D flip-flop circuit output and its input or the input of another D flip-flop circuit are minimal in terms of numbers of logic layers. In normal operation, these paths comprise only one multiplexer. The multiplexer is integrated or can be integrated with the D flip-flop circuit as a function of the technology.

BRIEF DESCRIPTION OF THE DRAWINGS

Other features and advantages of the present invention shall appear more clearly from the following description which in no way restricts the scope of the invention, and from the appended figures, of which.

MORE DETAILED DESCRIPTION

In order to understand the principle implemented in the frequency divider according to the invention, the following example relates to a three-ratio divider. The principle can also be applied to frequency dividers with more than 3 ratios, for example 4, 5 etc.

Figure 1:
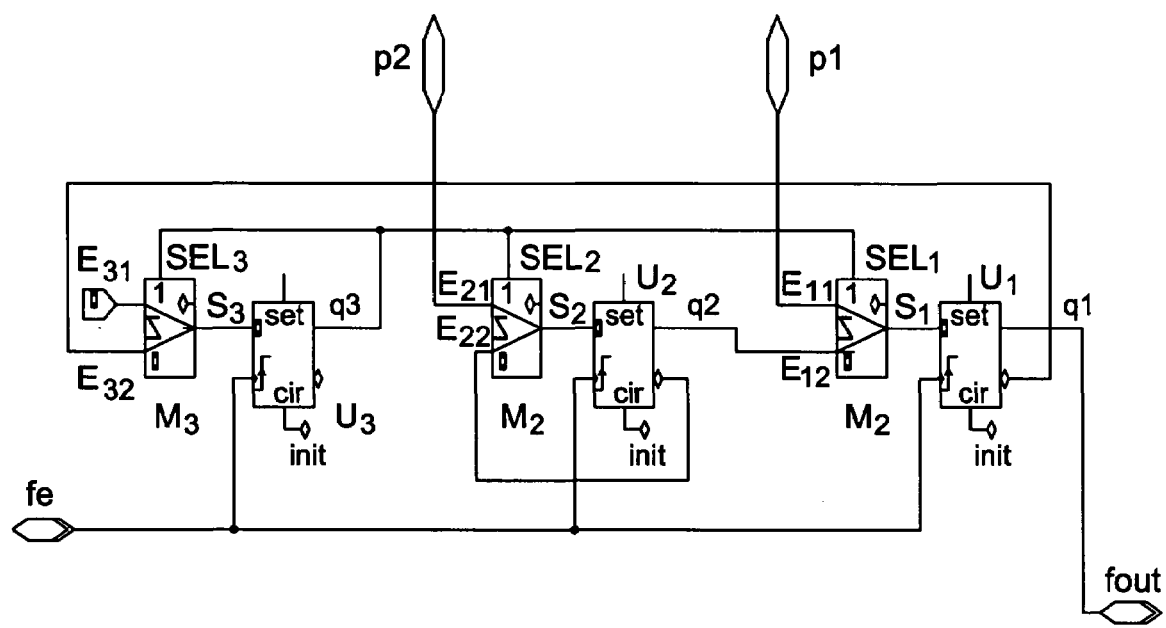
FIG. 1 exemplifies a frequency divider dividing by the ratios 2, 3, 4.

FIG. 1 provides a schematic view of a frequency divider dividing a frequency $F_e$ by three ratios 2, 3 and 4. The choice between the three division ratios is done by means of a command bus formed by two bits referenced P1 and P2.

The frequency divider comprises, for example, three D flip-flop circuits $U_1$, $U_2$, $U_3$ whose outputs are referenced Q1, Q2 and Q3. Q1 is the output of the divider. The input signals P1 and P2 can be used to control the division ratio of this divider. This scheme is optimal in terms of operating frequency because any feedback function between an output Q, $\overline{Q}$ of a D flip-flop circuit D and its input or the input of another D flip-flop circuit comprises, in normal operation, only one multiplexer $M_1$, $M_2$, $M_3$ which, in most technologies, is generally integrated or can be integrated with the D flip-flop circuit. A multiplexer comprises, for example, two inputs $E_{i1}$, $E_{i2}$, one selection bit SELi and one output Si, with i=1, 2, 3.

Any flip-flop circuit having an output that stores the value of the input at the instant of the clock transition (positive or negative clock signal edge) may also be used to replace a D flip-flop circuit.

In the present description, the term "multiplexer" designates a multiplexer or any other device that possesses one or more signal inputs, a selection input and an output that copies the value of one of the signal inputs as a function of the selection command.

The three flip-flop circuits work on the same clock signal $F_e$. The circuit thus constituted is characterized, for example, by the following equations:

$$Q1 = P1 * Q3 + Q2 * \overline{Q3}$$

$$Q2 = P2 * Q3 + \overline{Q2} * \overline{Q3}$$

$$Q3 = \overline{Q1} * \overline{Q3}$$

where "*" designates a logic AND and "+" designates a logic OR.

The following table 1 groups together the division ratio values obtained by the divider of FIG. 1.

| P1 | P2 | Division ratio obtained as a function of P1 and P2 |
|----|----|-----|
| 0 | 1 | The circuit divides by 2 |
| 1 | 0 | The circuit divides by 3 |
| 1 | 1 | The circuit divides by 4 |

Figure 2:
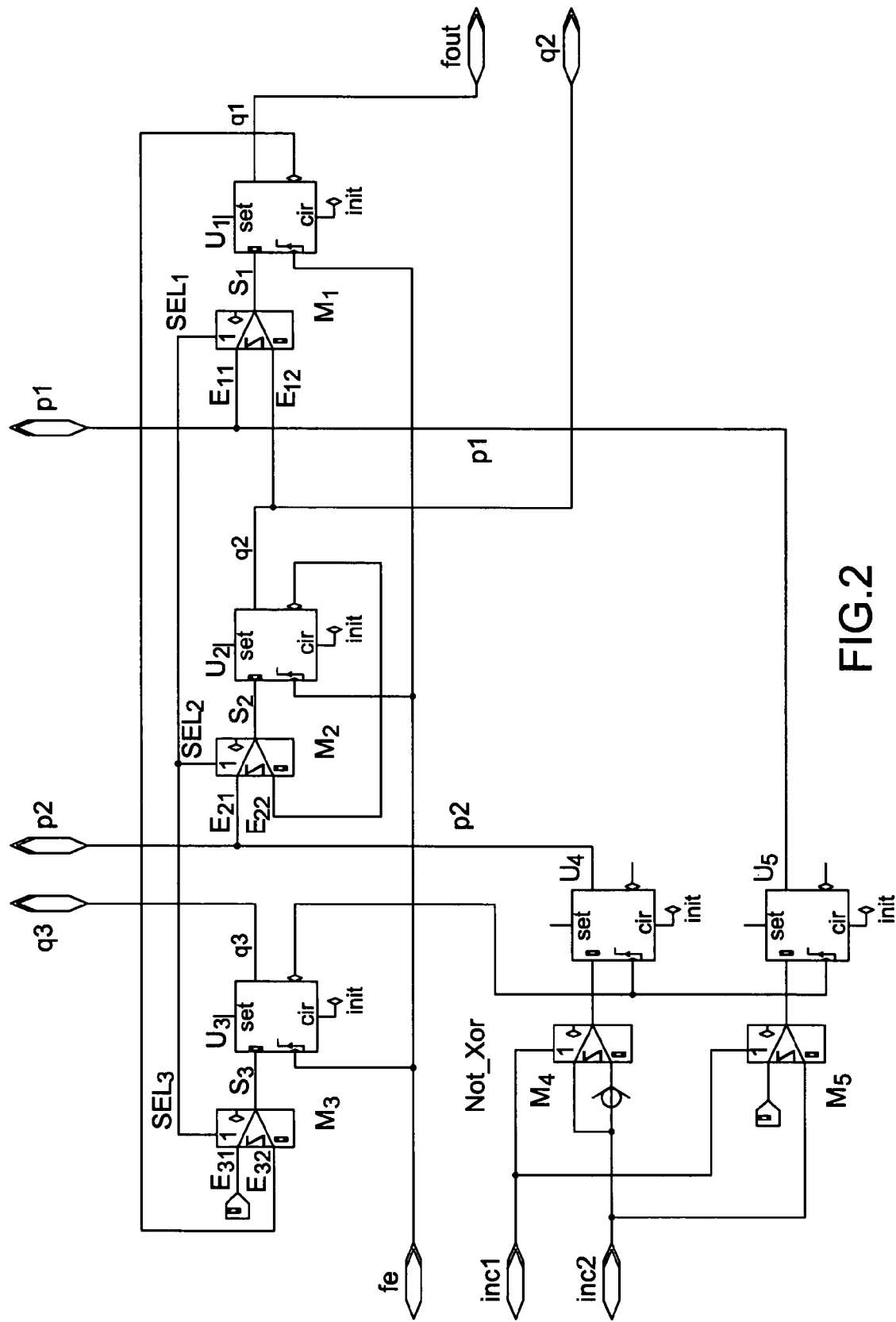
FIG. 2 shows an alternative embodiment of the divider of FIG. 1.

FIG. 2 represents an alternative embodiment used to process the disallowed case where P1=P2=0.

As compared with the divider of FIG. 1, the divider additionally has, for example, two latches $U_4$, $U_5$ and two 2 multiplexers $M_4$, $M_5$, respectively receiving the inputs INC1 and INC2 of the divider. The two latches may be replaced by two flip-flop circuits or any other device having the same function.

The working of the divider is given in the following table 2.

| INC1 | INC2 | |
|------|------|---|
| 0 | 0 | The circuit divides by 2 |
| 1 | 0 | The circuit divides by 3 |
| 0 | 1 | The circuit divides by 3 |
| 1 | 1 | The circuit divides by 4 |

For these two embodiments, one of the D flip-flop circuits commands the loading of the three flip-flop circuits $U_1$, $U_2$, $U_3$ during a period of the clock signal $F_e$. This operation is the optimum from the viewpoint of the positioning time for the commands P1 and P2 and the elimination of the false cycles.

Another characteristic of the device according to the invention is that Q1 has a low state with a duration equal to only one period of $F_e$ for all three division ratios. This low state is, for example, located at the end of a cycle of Q1. This characteristic is used when this circuit is used as a front-end divider in a division chain, in giving a possibility of selection of only one edge of the frequency $F_e$ per output cycle of the front-end divider.

According to another alternative embodiment, each D flip-flop circuit is subdivided into at least two latch circuits.

Another variant consists in keeping the same logic equations giving Q1, Q2 and Q3 which are characteristic of the circuit and in applying the usual logic transformations to them. An example of a transformation consists in complementing the two parts of each equation.

Without departing from the framework of the invention, any flip-flop circuit whose output stores the value of the input at the instant of the clock transition (positive or negative clock signal edge) can be used in the divider according to the invention.

What is claimed is:

1. A divider to divide a frequency comprising:
   three flip-flop circuits, each of the flip-flop circuits receiving the frequency to be divided, each feedback loop between an output of a flip-flop circuit and its input or the input of the other flip-flop circuits comprising a single multiplexer, wherein one of the flip-flop circuits commands the loading of all the flip-flop circuits during one period of the frequency and
   two latch circuits and two multiplexers, respectively receiving two inputs of the divider.

2. The device according to claim 1, wherein a multiplexer has two inputs, one selection bit and one output and is integrated into a flip-flop circuit.

3. The device according to claim 1, wherein a multiplexer is integrated with a flip-flop circuit.

4. The divider with three division ratios comprising a device according to claim 1.

5. A divider to divide a frequency $F_e$, comprising:
   a first, a second and a third flip-flop circuit, each of the flip-flop circuits receiving the frequency ($F_e$) to be divided, each feedback loop between an output of a flip-flop circuit and its input or the input of the other flip-flop circuits including a single multiplexer,
   wherein the second flip-flop circuit comprises a feedback loop including a single multiplexer, the output of the second flip-flop being one of input of the multiplexer, and
   one of the flip-flop circuit commands the loading of all the flip-flop circuits during one period of the frequency ($F_e$) and two latch circuits and two multiplexers, respectively receiving two inputs of the divider.

6. The divider of claim 5, wherein the divider has three division ratios.

* * * * *